United States Patent [19]
Weisman

[11] Patent Number: 6,020,261
[45] Date of Patent: Feb. 1, 2000

[54] PROCESS FOR FORMING HIGH ASPECT RATIO CIRCUIT FEATURES

[75] Inventor: Douglas H. Weisman, Sunrise, Fla.

[73] Assignee: Motorola, Inc., Schaumburg, Ill.

[21] Appl. No.: 09/323,256

[22] Filed: Jun. 1, 1999

[51] Int. Cl.$^7$ .................................................. B44C 1/22
[52] U.S. Cl. .................... 438/669; 438/669; 438/687; 438/703; 438/672; 438/674
[58] Field of Search .................................. 438/669, 687, 438/703, 672, 674, 675

[56] References Cited

U.S. PATENT DOCUMENTS

| | | | |
|---|---|---|---|
| 5,028,454 | 7/1991 | Lytle et al. | 427/123 |
| 5,281,304 | 1/1994 | Kadomura | 156/656 |
| 5,525,204 | 6/1996 | Surboff et al. | 205/125 |
| 5,792,594 | 8/1998 | Brown et al. | 430/315 |
| 5,937,326 | 6/1995 | Cho | 438/669 |

*Primary Examiner*—Charles Bowers
*Assistant Examiner*—Lisa Kilday

*Attorney, Agent, or Firm*—Dale W. Dorinski

[57] ABSTRACT

A method of forming high resolution circuit features on a substrate. A 'seed' layer of copper (110) is deposited on a dielectric substrate (100). A dielectric layer (120) is then deposited on the copper layer, and an aluminum 'mask' layer (130) is deposited on the dielectric layer. A photoresist layer (140) is spun on or laminated to the aluminum. The photoresist layer is imaged and developed to define a circuit pattern such that portions (230) of the aluminum 'mask' layer are revealed, and these revealed portions are further etched so as to reveal portions (320) of the dielectric layer that are directly underneath. The remaining portions of the photoresist layer are stripped away, along with the revealed underlying portions of the dielectric film, exposing portions (410) of the copper layer in the image of the circuit pattern. The remaining portions of the aluminum mask are then removed, and the exposed copper is then electroplated to form the desired circuit traces (600). The remaining portions of the dielectric layer are stripped to expose the unplated portions of the copper layer, and these unplated portions are etched away with acid.

6 Claims, 2 Drawing Sheets

PROCESS FOR FORMING HIGH ASPECT RATIO CIRCUIT FEATURES

TECHNICAL FIELD

This invention relates to methods of forming high resolution circuit patterns on a substrate.

BACKGROUND

The need to produce electronic circuits having very fine line widths and spaces has led to the use of thin photoresists. The resists used in the semiconductor industry are capable of producing extremely fine lines and spaces, but these thin resists also inherently limit the thickness of the resultant plated line. In high density circuits where there is a need to carry high current, increasing the thickness (i.e. height) of the line provides the needed conductor cross section without sacrificing circuit density. However, when using the conventional photolithography processes, thin photoresists limit the designer's ability to achieve the needed cross sectional area, and this is not a desirable condition. Clearly, a need exists to provide high aspect ratio circuit lines in a high density pattern, and a method that could overcome the limitations of thin photoresists would be a significant boon to the electronics industry.

DETAILED DESCRIPTION OF THE PREFERRED EMBODIMENT

Figure 1:
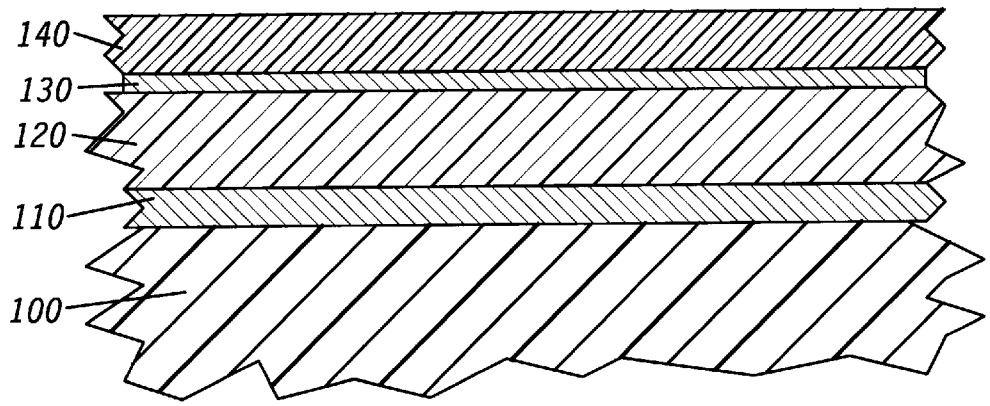
FIG. 1 is a cross-sectional view of a substrate coated with an electrically conductive layer, a dielectric layer, a masking layer and a photochemically active layer, in accordance with the invention.

A method of forming high resolution circuit features on a substrate consists of the following steps. A 'seed' layer of copper is deposited on a dielectric substrate. A dielectric layer is then deposited on the copper layer, and an aluminum 'mask' layer is deposited on the dielectric layer. A photoresist layer is spun on or laminated to the aluminum. The photoresist layer is imaged and developed to define a circuit pattern such that portions of the aluminum 'mask' layer are revealed, and these revealed portions are further etched so as to reveal portions of the dielectric layer that are directly underneath. The remaining portions of the photoresist layer are stripped away, along with the revealed underlying portions of the dielectric film, exposing portions of the copper layer in the image of the circuit pattern. The remaining portions of the aluminum mask are then removed, and the exposed copper is then electroplated to form the desired circuit traces. The remaining portions of the dielectric layer are stripped to expose the unplated portions of the copper layer, and these unplated portions are etched away with acid.

While the specification concludes with claims defining the features of the invention that are regarded as novel, it is believed that the construction, method of operation and advantages of the invention will be better understood from a consideration of the following description in conjunction with the drawing figures, in which like reference numerals are carried forward. For purposes of clarity, relative dimensions of the various elements have been exaggerated, and the reader should be aware that the drawing figures are not to scale.

Figure 2:
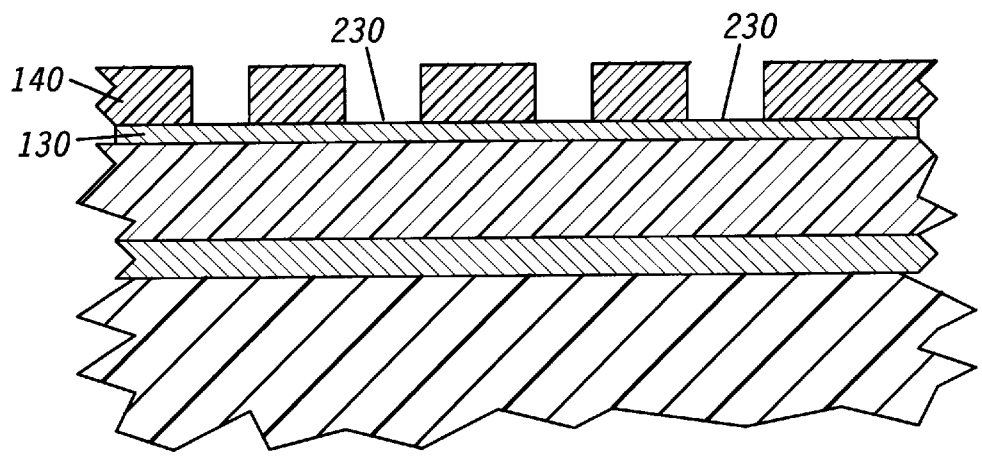
FIG. 2 is a cross-sectional view of the structure shown in FIG. 1 after defining a pattern in the photochemically active layer.
Figure 3:
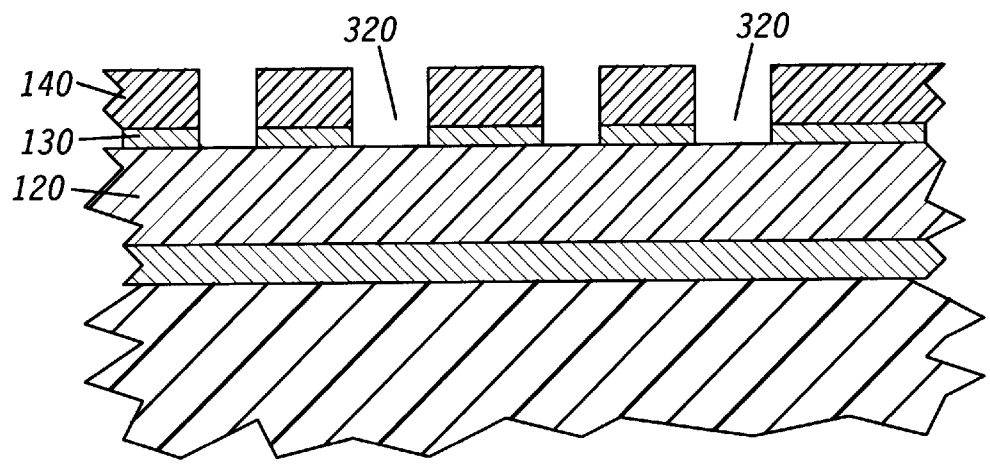
FIG. 3 is a cross-sectional view of the structure shown in FIG. 2 after removing the exposed portions of the masking layer.
Figure 4:
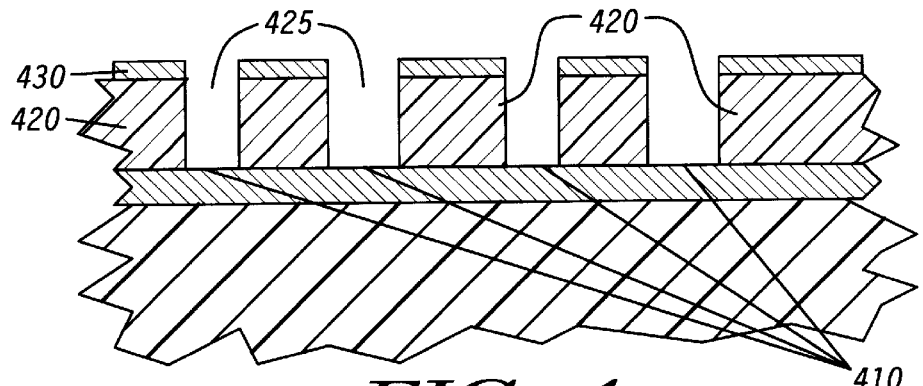
FIG. 4 is a cross-sectional view of the structure shown in FIG. 3 after removing the remainder of the photochemically active layer and delineating the pattern in the dielectric layer.
Figure 5:
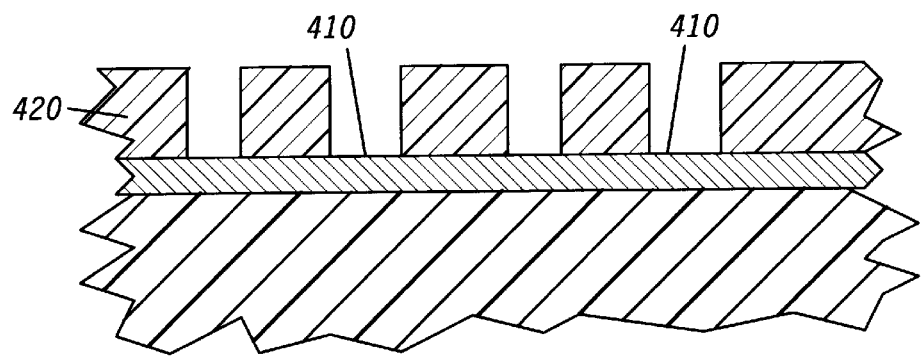
FIG. 5 is a cross-sectional view of the structure shown in FIG. 4 after stripping away the remainder of the masking layer.
Figure 6:
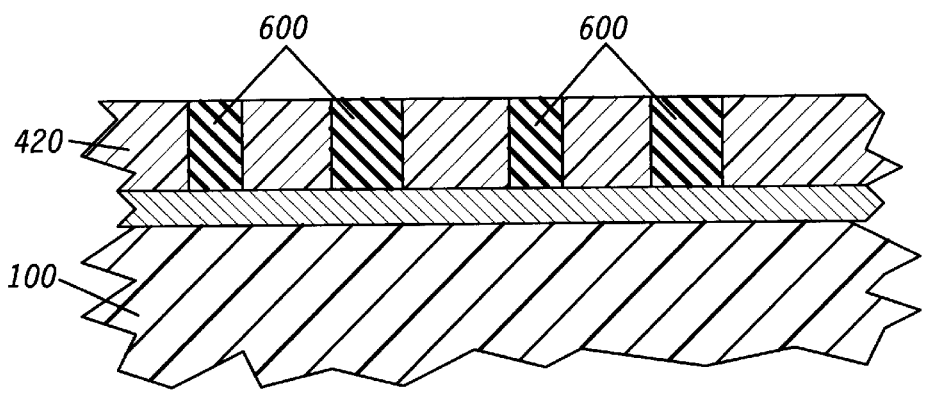
FIG. 6 is a cross-sectional view of the structure shown in FIG. 5 after the step of plating.
Figure 7:
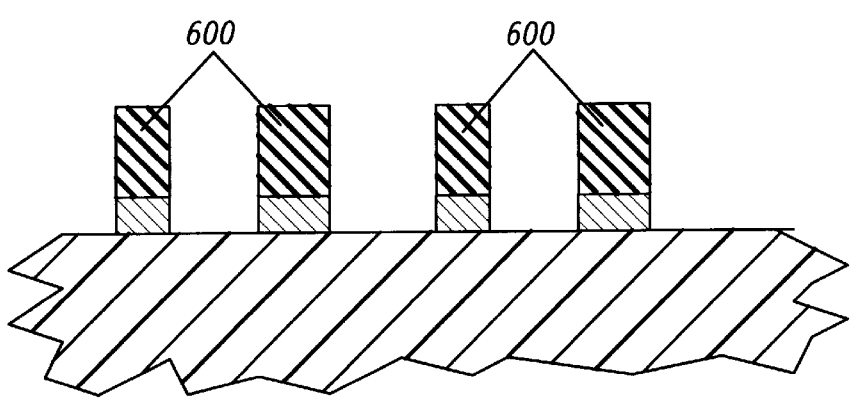
FIG. 7 is a cross-sectional view of the structure shown in FIG. 6 after stripping away the remnants of the dielectric layer and the underlying portions of the electrically conductive layer.

Referring now to FIG. 1, a dielectric substrate 100 has an electrically conductive layer of metal 110 deposited thereon. Although the drawing figures only show a single layer 110 of metal, those skilled in the art will appreciate that multiple layers of different metals can be employed to achieve various advantages, and our invention is not intended to be limited by this. For example, in one embodiment where vacuum deposition of the conductive metal was used, a very thin (approximately 400 Angstroms) layer of chromium was first sputtered on the substrate to act as a 'glue' layer and promote adhesion of a subsequent layer (approximately 2000 Angstroms) of copper. The purpose of this metal layer 110 is to provide an electrically conductive 'seed' layer for subsequent electroplating. On top of the metal layer 110 is deposit a dielectric layer 120, such as a dry film photoresist or other suitable material. This layer does not have to be photochemically reactive, but if it is, it should be appropriately cured using thermal, light or other oxidative means. The surface of the dielectric layer 120 is covered with a layer of a metal 130 which will subsequently be used as a mask in a reactive ion etch (RIE) process. One preferable material way to make the masking layer is to evaporate or sputter a thin (approximately 2000 Angstroms) layer of aluminum in a vacuum deposition chamber. A layer of photoresist 140 is then formed upon the metal layer 130 to aid in patterning the aluminum. Either positive acting or negative acting photoresists can be employed, with our drawings depicting the use of a positive photoresist. Since this photoresist layer is not being used as the resist for the electroplating, a much thinner resist can be used compared to that normally employed. This allows for higher resolution features than are otherwise achievable in conventional art. Referring now to FIG. 2, the photoresist 140 is imaged with the artwork of the desired circuit pattern using ultraviolet light, so as to expose selected areas 230 of the metal layer 130. In FIGS. 3 and 4, these exposed portions of the aluminum layer and the underlying portions of the dielectric layer are then removed by a two-step RIE process. First, the exposed portions of the aluminum are dry etched using $BCl_3/Cl_2$ gas to expose portions 320 of the dielectric layer 120 that are directly underneath. This creates an exact duplicate pattern in the aluminum layer that allows the aluminum to be used as an etch mask for the next step. Next, the remaining portions of the photochemically active layer 140 are removed by reactive ion etching using oxygen gas. The oxygen plasma generally attacks organic materials, but does not attack inorganic materials, such as the aluminum mask. As shown in FIG. 4, the patterned aluminum layer 430 serves to protect the dielectric layer 120 in those areas 420 where it is covered by the aluminum, but allows the oxygen plasma to etch away those portions 425 of the dielectric layer that have been revealed by the openings in the aluminum mask. After a suitable period of time in the RIE chamber, the dielectric film has been etched down to the underlying copper, exposing portions 410 of the copper in a pattern that is an exact replica of that in the original artwork used to photodefine the photochemically active layer. Again, because the oxygen plasma does not attack metals, the etching stops when the copper has been exposed, thus creating an 'automatic' and highly controllable end to the RIE process. The next step, FIG. 5, removes the patterned aluminum mask. The etchant used to remove the aluminum must not affect the newly exposed copper 410 nor the patterned dielectric layer. Even the slightest attack may cause swelling or lifting of the miniature patterns in the dielectric layer. Then the substrate 100 with the exposed copper is electroplated in conventional manner, using the patterned dielectric film 420 as the plating resist (FIG. 6), until the circuit pattern 600 reaches the desired thickness. Typically, copper is plated, along with nickel and gold, which is used as an etch resist for the next step. After plating, the patterned dielectric layer 420 is removed by another RIE step, again etching with oxygen plasma. Note that now the patterned dielectric layer is not protected by a metal mask, and thus can be easily attacked. With the unplated portions of the base copper now exposed, a final etching step, either wet chemical or dry etching, is used to remove the field copper around the electroplated features 600, resulting in the structure depicted in FIG. 7. A dilute solution of ammonium persulfate will remove the thin copper 'seed' layer without adversely affecting the plated features. If there is an underlying chromium 'glue' layer, it can be removed with an alkaline potassium permanganate solution.

In summary, a new method of creating high resolution metal circuitry on substrates has been devised. The method produces printed circuit boards or wafers that have closely spaced conductors of significant thickness (i.e. high aspect ratio) without the usual condition of shorting between conductors, using a metal mask, which has heretofore been unknown. While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of forming high resolution circuit features on a substrate, comprising the following steps in the order named:

providing a dielectric substrate having an electrically conductive layer deposited thereon;

depositing a dielectric film on the electrically conductive layer;

depositing a metal film on the dielectric film;

depositing a photoresist layer on the metal film;

selectively removing portions of the photoresist layer such that portions of the metal film are revealed;

removing the revealed portions of the metal film by etching, so as to reveal underlying portions of the dielectric film;

removing the remaining portions of the photoresist layer and the revealed underlying portions of the dielectric film so as to expose portions of the electrically conductive layer;

removing the remaining portions of the metal film;

plating copper onto the exposed portions of the electrically conductive layer;

removing the remaining portions of the dielectric layer so as to expose additional portions of the electrically conductive layer;

removing the exposed portions of the electrically conductive layer.

2. The method as described in claim 1, wherein the metal film is aluminum.

3. The method as described in claim 1, wherein the step of plating comprises electroplating.

4. The method as described in claim 1, wherein the steps of removing the revealed portions of the metal film, removing the remaining portions of the photoresist layer and the revealed underlying portions of the dielectric film are performed by reactive ion etching.

5. The method as described in claim 1, wherein the step of removing the remaining portions of the photoresist layer and the revealed underlying portions of the dielectric film is performed in a single step.

6. A method of forming high resolution circuit features on a substrate, comprising the following steps in the order named:

providing a substrate having a copper layer deposited thereon;

depositing a dielectric layer on the copper layer;

depositing an aluminum mask on the dielectric layer;

depositing a photoresist layer on the aluminum mask;

developing the photoresist layer such that portions of the aluminum mask are revealed;

etching the revealed portions of the aluminum mask, so as to reveal underlying portions of the dielectric layer;

removing the remaining portions of the photoresist layer and the revealed underlying portions of the dielectric film so as to expose portions of the copper layer;

removing the remaining portions of the aluminum mask;

plating copper onto the exposed portions of the copper layer;

removing the remaining portions of the dielectric layer so as to expose additional portions of the copper layer;

removing the exposed portions of the copper layer.

* * * * *